United States Patent
Allen et al.

(10) Patent No.: US 7,545,041 B2
(45) Date of Patent: Jun. 9, 2009

(54) TECHNIQUES FOR PATTERNING FEATURES IN SEMICONDUCTOR DEVICES

(75) Inventors: Scott D. Allen, Wappingers Falls, NY (US); Katherina E. Babich, Chappaqua, NY (US); Steven J. Holmes, Guilderland, NY (US); Arpan P. Mahorowala, Bronxville, NY (US); Dirk Pfeiffer, Dobbs Ferry, NY (US); Richard Stephan Wise, New Windsor, NY (US)

(73) Assignee: International Business Machines Corporation, Armonk, NY (US)

(*) Notice: Subject to any disclaimer, the term of this patent is extended or adjusted under 35 U.S.C. 154(b) by 421 days.

(21) Appl. No.: 11/337,411

(22) Filed: Jan. 23, 2006

(65) Prior Publication Data

US 2006/0118785 A1 Jun. 8, 2006

Related U.S. Application Data

(62) Division of application No. 10/661,041, filed on Sep. 12, 2003, now Pat. No. 7,030,008.

(51) Int. Cl.
H01L 23/48 (2006.01)
H01L 23/52 (2006.01)
H01L 29/40 (2006.01)

(52) U.S. Cl. .......................... 257/751; 257/758
(58) Field of Classification Search .......... 257/750–771
See application file for complete search history.

(56) References Cited

U.S. PATENT DOCUMENTS

| | | | |
|---|---|---|---|
| 4,814,041 A | 3/1989 | Auda | |
| 5,753,418 A | 5/1998 | Tsai et al. | 430/313 |
| 5,854,503 A * | 12/1998 | Hsueh et al. | 257/347 |
| 6,009,888 A | 1/2000 | Ye et al. | 134/1.3 |
| 6,245,640 B1 * | 6/2001 | Claussen et al. | 438/700 |
| 6,316,167 B1 | 11/2001 | Angelopoulos et al. | 430/313 |
| 6,387,798 B1 | 5/2002 | Loke et al. | 438/623 |
| 6,514,867 B1 | 2/2003 | Hui et al. | 438/713 |
| 6,774,032 B1 * | 8/2004 | Park | 438/640 |

(Continued)

FOREIGN PATENT DOCUMENTS

KR 0256137 5/1998

(Continued)

OTHER PUBLICATIONS

Chun et al., "Contact Hole Size Reducing Methods by Using Water-Soluble Organic Over-Coating Material (WASOOM) as a Barrier Layer Toward 0.15 um Contact Hole; Resist Flow Technique I," Proc. SPIE, vol. 3999, pp. 620-626 (2000).

(Continued)

*Primary Examiner*—Cuong Q Nguyen
(74) *Attorney, Agent, or Firm*—Daniel P. Morris, Esq.; Ryan, Mason & Lewis, LLP

(57) ABSTRACT

Techniques for semiconductor processing are provided. In one aspect, a method for patterning one or more features in a semiconductor device comprises the following step. At least one critical dimension of the one or more features is reduced during etching of the antireflective material. A lithographic structure is also provided.

1 Claim, 4 Drawing Sheets

U.S. PATENT DOCUMENTS 6,828,259 B2 * 12/2004 Fisher et al. ................ 438/795
2002/0137339 A1 9/2002 Takeuchi
2004/0009662 A1 * 1/2004 Park et al. ................... 438/640

FOREIGN PATENT DOCUMENTS

TW 550695 9/2003

OTHER PUBLICATIONS

Chung et al., "A Novel Resist Material for sub-100 nm Contact Hole Pattern," Proc. SPIE, vol. 3999, pp. 305-312 (2000).

DellaGuardia et al., "193 Lithography and RELACS™ Processing for BEOL Lithography," Proc. SPIE, vol. 4346, pp. 1029-1040 (2001).

Lucas et al., "193 nm Contact Photoresist Reflow Feasibility Study," Proc. SPIE, vol. 4345, pp. 725-736 (2001).

Satou et al., "Sub-0.10 μm Hole Fabrication Using Bilayer Silylation Process for 193 nm Lithography," Jpn. J. Appl. Phys. 1, vol. 38, Part 1, No. 12B, pp. 7008-7012 (Dec. 1999).

Azuma Shigeru, "Coating of Stator Core," Patent Abstracts of Japan, Publication No. 07-222413, Application No. 06-026205 (Aug. 18, 1995).

Angelopoulos et al., "Lithographic Structure," Patent Abstracts of Japan, Publication No. 2001-242630 (Sep. 7, 2001).

* cited by examiner

100

TECHNIQUES FOR PATTERNING FEATURES IN SEMICONDUCTOR DEVICES

CROSS-REFERENCE TO RELATED APPLICATIONS

This application is a divisional application of U.S. patent application Ser. No. 10/661,041, filed Sep. 12, 2003, now U.S. Pat. No. 7,030,008.

FIELD OF THE INVENTION

The present invention relates to semiconductor processing and, more particularly, to reducing critical dimensions of features patterned in a semiconductor device.

BACKGROUND OF THE INVENTION

Technology often demands the patterning of features smaller than those lithographically possible. For example, while patterning features, such as contact holes and vias, it may be desirable to have features with critical dimensions defined in the substrate that are smaller than lithographically defined in the resist. The critical dimensions of a feature comprise the characteristic dimensions of the feature attained by the technology employed. Conventional techniques to reduce the critical dimensions of patterned features exist, however, these techniques have several drawbacks.

One common technique to reduce the critical dimensions includes the use of resist reflow and overcoat films, e.g., resolution enhancement lithography assisted by chemical shrink (RELACS) processes. Resist reflow is extremely difficult to control because very small temperature variations across the bake plate can cause large variations in the critical dimensions across each wafer. Typical sensitivities are on the order of ten nanometers per degree celcius (nm/° C.). Overcoat films can be spun on top of a photo-developed chemically amplified resist. The photoacid from the resist diffuses into the overcoat film crosslinking it. The parts of the overcoat film that are not in physical contact with the resist, for example, a feature bottom, are not crosslinked, and therefore can be developed away. This technique, being highly specific to the resist type, is difficult to implement. Moreover, the crosslinked overcoat film offers poor etch resistance during the substrate etch step, thus, negating any reductions in critical dimensions obtained. Silylating resists can also be used to chemically bias resist features, but they also suffer from cross-wafer and nested-isolated bias issues. The above techniques may further result in features having corners that are not sharp, but rounded.

Another common technique is to use a polymerizing etch chemistry to induce a taper in the substrate thereby reducing the critical dimensions at a feature bottom. The critical dimensions of the feature at the top of the substrate are approximately the same as the critical dimensions obtained after etching an overlying layer, e.g., an antireflective layer. The feature sidewalls created in the substrate are slightly tapered, which is desirable for many applications. For example, after contact holes or vias are patterned in a dielectric layer, the copper seed layer deposition is facilitated by dielectric substrate sidewalls that are not perfectly vertical, but slightly tapered. However, the maximum amount of reduction of the critical dimensions depends on the amount of sidewall taper that can be tolerated. As an example, if the dielectric layer is about 500 nanometers (nm) thick and if the sidewall is about 88.5 degrees to the horizontal, the feature bottom will be approximately 20 nm smaller than the feature top. If the critical dimensions of the feature top is too large to begin with, the effectiveness of this technique is at best very limited.

Therefore, it would be desirable to have techniques for reducing the critical dimensions of patterned features that are effective, reproducible and versatile for patterning features having a broad range of critical dimension specifications. Further, techniques for reducing the critical dimensions of patterned features are needed that can be employed irrespective of the type of resist used, and provide for the mass-production of features that are uniform over entire wafers.

SUMMARY OF THE INVENTION

The present invention provides techniques for semiconductor processing. In one aspect of the invention, a method for patterning one or more features in a semiconductor device comprises the following step. At least one critical dimension of the one or more features is reduced during etching of the antireflective material.

In another aspect of the invention, a lithographic structure comprises an antireflective material having a feature patterned therein, the feature having at least one reduced critical dimension.

A more complete understanding of the present invention, as well as further features and advantages of the present invention, will be obtained by reference to the following detailed description and drawings.

DETAILED DESCRIPTION OF PREFERRED EMBODIMENTS

Figure 1:
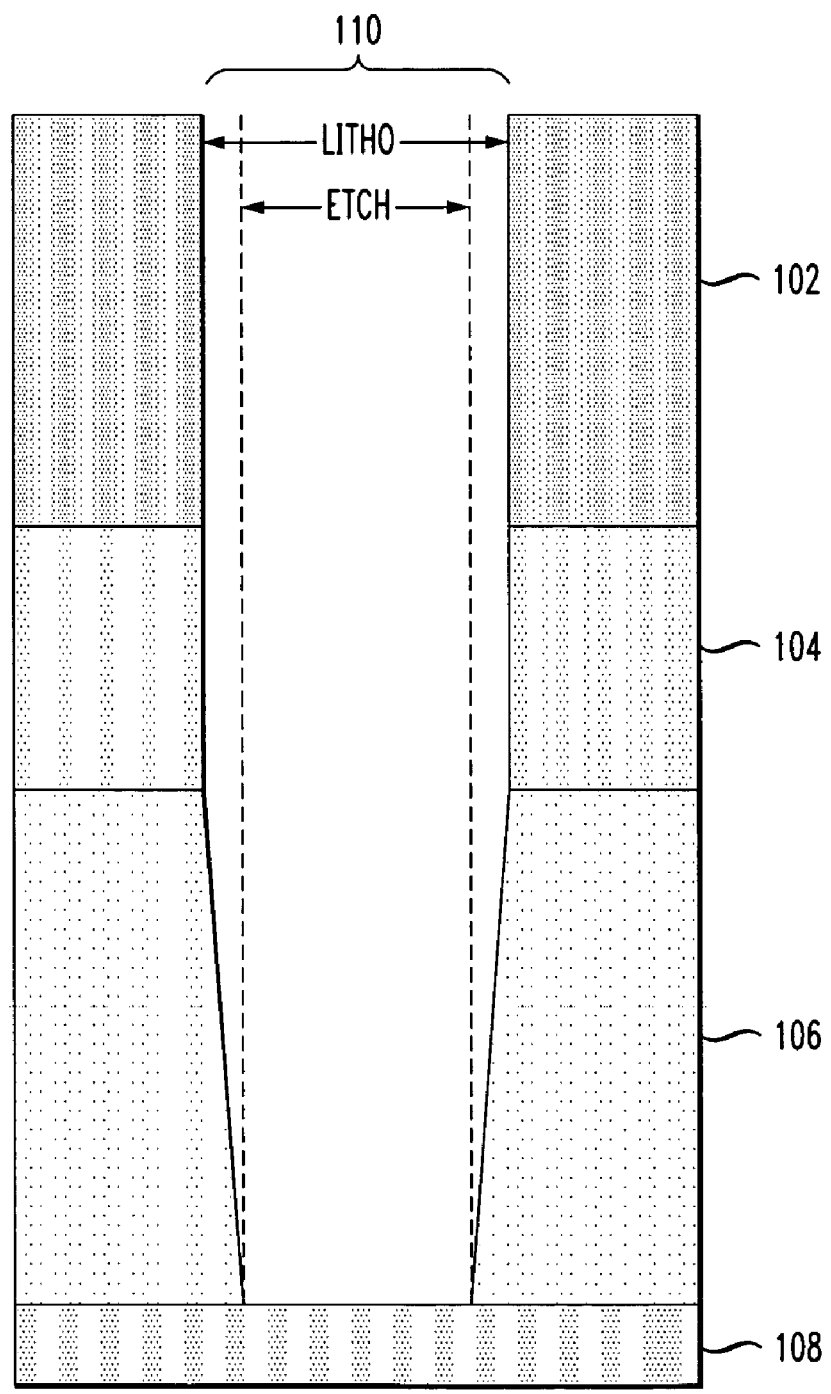
FIG. 1 is a diagram illustrating a semiconductor device with a feature having reduced critical dimensions etched therein using conventional techniques.

FIG. 1 is a diagram illustrating a semiconductor device with a feature having reduced critical dimensions etched therein using conventional techniques. As shown in FIG. 1, semiconductor device 100 comprises radiation sensitive imaging layer 102 deposited on antireflective material 104. Antireflective material 104 is deposited on substrate 106. Substrate 106 is deposited on nitride layer 108. Feature 110 is etched into radiation sensitive imaging layer 102, antireflective material 104 and substrate 106.

According to conventional methods for reducing the critical dimensions of etched features in semiconductor devices, the critical dimensions of feature 110 are changed, i.e., reduced, solely in substrate 106. As such, the critical dimensions of feature 110 remain unchanged during the etching of radiation sensitive imaging layer 102 and antireflective material 104. Reduction of the critical dimensions of feature 110 in radiation sensitive imaging layer 102 or antireflective material 104 is practically impossible if either layer comprises predominately organic species, as is the case with semiconductor device 100.

As will be described below, the amount that the critical dimensions of a feature can be reduced, solely during etching of the substrate, is limited. Trying to reduce the critical dimensions of a feature in a single layer, such as the substrate, may lead to artifacts that damage the feature.

Figure 2:
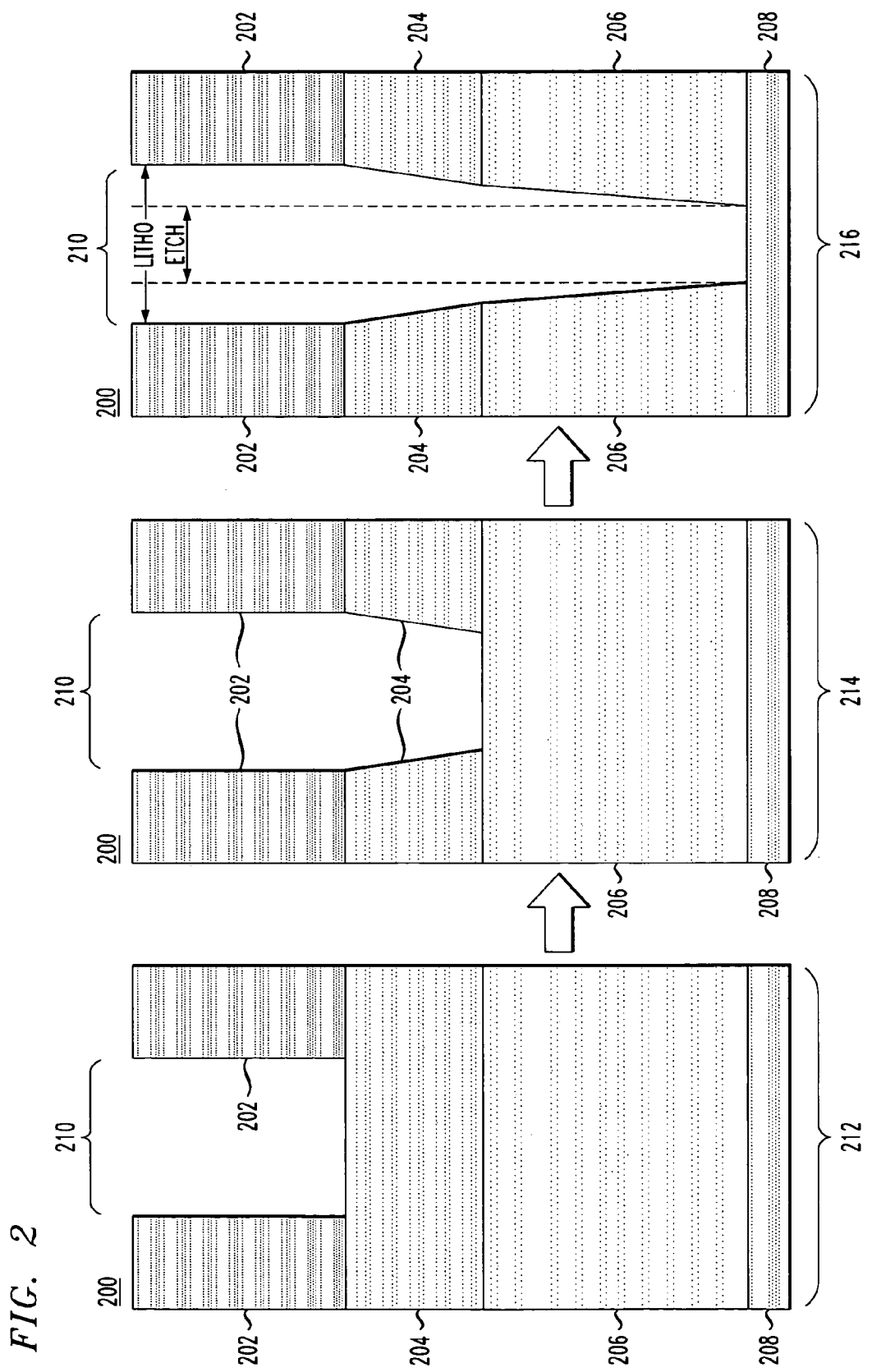
FIG. 2 is a diagram illustrating an exemplary technique for reducing the critical dimensions of a feature of a semiconductor device according to an embodiment of the present invention.

FIG. 2 is a diagram illustrating an exemplary technique for reducing the critical dimensions of a feature of a semiconductor device. When processing semiconductor devices, the critical dimensions of a feature comprise the characteristic dimensions of the feature attained by the technology employed. For example, when the feature comprises a contact hole, as is described in detail below, the critical dimensions may represent a measure of the diameter of the contact hole produced.

The techniques for reducing the critical dimensions of a feature may also be employed to tune the critical dimensions of the feature, as will be described in detail below. The term "tune," as used herein, pertains to controlling the amount by which the critical dimensions are changed.

As shown in FIG. 2, semiconductor device 200 comprises radiation sensitive imaging layer 202 deposited on antireflective material 204. Antireflective material 204 is deposited on substrate 206. Substrate 206 is deposited on nitride layer 208. Feature 210 is etched into radiation sensitive imaging layer 202, antireflective material 204 and substrate 106, as is shown in steps 212, 214 and 216, respectively.

In step 212 of FIG. 2, feature 210 is etched into radiation sensitive imaging layer 202. During the etching of feature 210 into radiation sensitive imaging layer 202, the critical dimensions of feature 210 may change, or remain the same, as will be described in detail below. For example, the critical dimensions of feature 210 in step 212 of FIG. 2 do not change.

As will be further described below, radiation sensitive imaging layer 202 should be compositionally different from antireflective material 204, upon which radiation sensitive imaging layer 202 is deposited, to achieve a desired level of etch selectivity between the layers. Radiation sensitive imaging layer 202 may be deposited using any conventional deposition technique, including, but not limited to, spin on deposition and/or plasma enhanced chemical vapor deposition (PECVD).

Feature 210 may comprise any structure that may be introduced to a semiconductor device by lithographic techniques. Exemplary structures include, but are not limited to, contact holes, via patterns, lines, spaces, ovals and combinations comprising at least one of the foregoing features. As will be described in detail below, in conjunction with the description of FIGS. 3 and 4, an exemplary feature 210 comprises a contact hole.

As disclosed herein, the critical dimensions of feature 210 are reduced. For example, when feature 210 comprises a contact hole, the present techniques may be employed to reduce the diameter of the contact hole. When feature 210 comprises lines and spaces, the present techniques may be employed to reduce the spacing between lines.

In step 214 of FIG. 2, feature 210 is etched into antireflective material 204, which is deposited on substrate 206. Antireflective material 204 comprises one or more inorganic moieties. In an exemplary embodiment, antireflective material 204 has the structural formula M:C:H:X. The symbol 'M' represents a metallic or semi-metallic element, including, but not limited to, silicon (Si), titanium (Ti), germanium (Ge), iron (Fe), boron (B), tin (Sn) and combinations comprising at least one of the foregoing metallic elements. The symbol 'C' represents the element carbon. The symbol 'H' represents the element hydrogen. The symbol 'X' represents an inorganic element, including, but not limited to, oxygen (O), hydrogen, nitrogen (N) and combinations comprising at least one of the foregoing inorganic elements. In an exemplary embodiment, antireflective material 204 has the structural formula, Si:C:H:O.

Antireflective material 204 may be deposited on substrate 206 by any conventional deposition technique. In an exemplary embodiment, antireflective material 204 is deposited on substrate 206 using spin on processing. For example, when antireflective material 204 comprises silicon, antireflective material 204 may be deposited on substrate 206 by spin on processing. In another exemplary embodiment, antireflective material 204 is deposited on substrate 206 using PECVD. For example, antireflective material 204 may comprise a tunable etch resistant antireflective (TERA) coating comprising, for example, Si, C, O and H. When antireflective material 204 comprises a TERA coating, antireflective material 204 may be deposited on substrate 206 by PECVD. PECVD films tend to be conformal. Therefore, antireflective material 204 may comprise a conformally deposited material. Conformally deposited materials conform to the contours of the surface on which they are applied. When antireflective material 204 comprises a conformally deposited material, antireflective material 204 is typically deposited using PECVD.

The thickness of antireflective material 204 is dependent on the antireflective material composition. For example, when antireflective material 204 comprises silicon, and is deposited on substrate 206 using spin on processing, the thickness of antireflective material 204 may be greater than or equal to about 80 nanometers. In an exemplary embodiment, antireflective material 204 is deposited on substrate 206 using spin on processing to a thickness of about 80 nanometers, about 130 nanometers or greater than or equal to about 190 nanometers to optimize the antireflective properties.

The critical dimensions of feature 210 are reduced during the etching of antireflective material 204. Reducing, at least in part, the critical dimensions of feature 210 during the etching of antireflective material 204 is beneficial, as trying to completely reduce the critical dimensions of feature 210 solely during subsequent etching steps, i.e., during the etching of substrate 206, as described above in conjunction with the description of FIG. 1, if at all possible, may produce effects damaging to the feature. For example, trying to reduce of the critical dimensions of a feature solely during the etching of the substrate may lead to excessive tapering of the feature causing undesirable artifacts to occur, such as electrical shorting of adjacent features when, e.g., copper is plated.

To reduce the critical dimensions of feature 210 during etching of antireflective material 204, a plasma etching technique may be employed. The plasma etching technique comprises a plasma made up of gasses, including, but not limited to, fluorocarbon gas, argon gas, oxygen gas, nitrogen gas and combinations comprising at least one of the foregoing gasses. In an exemplary embodiment, plasma polymerizing etch chemistries (hereinafter "plasma polymerizing etch") may be employed. The plasma polymerizing etch comprises at least one fluorocarbon gas, for example, $C_4F_6$, $C_4F_8$ and/or $CH_3F$ as an etchant and as a polymeric species, nitrogen gas as a polymerization reaction aid which alters the plasma conditions, oxygen gas as a polymerization reaction control and argon gas as a source of argon ions which are needed to remove portions of the fluoropolymer formed to prevent excessive amounts of polymerization and deposition. An exemplary plasma polymerizing etch, according to the teachings herein, comprises about 300 parts by volume argon gas, about 150 parts by volume nitrogen gas, about five parts by volume $C_4F_8$ gas, about five parts by volume oxygen gas and about five parts by volume $CH_3F$ gas.

The plasma polymerizing etch deposits polymeric materials, typically in the form of layers (hereinafter "polymer layers"), on the walls of feature 210 during etching. The total thickness of the polymer layers deposited, e.g. from about ten nanometers to about 500 nanometers, should be controlled such that the plasma polymerizing etchant species may still diffuse through the polymer layers and etch antireflective material 204. The thickness of the polymer layers deposited depends on the composition of the polymeric materials and whether the particular surface is subject to ion bombardment. For example, during etching of feature 210, the thickness of the polymer layers deposited during etching of radiation sensitive imaging layer 202 is greater than the thickness of the polymer layers deposited during etching of antireflective material 204. In an exemplary embodiment, the total thickness of the polymer layers deposited during etching of radiation sensitive imaging layer 202 is up to about four nanometers at the thickest portion. For example, the total thickness of the polymer layers deposited during etching of radiation sensitive imaging layer 202 is between about one to about three nanometers at the thickest portion. The plasma polymerizing etch may be employed to reduce the critical dimensions of a feature by up to about 80 nanometers during etching of the antireflective material.

In step 214 of FIG. 2, the polymer layers deposited cause a reduction in the critical dimensions of feature 210 by causing the walls of feature 210 to taper in. The reduction, or 'choking', of feature 210 does not however require that the polymer layers deposited form such a gradually tapered configuration, so long as the polymer layers deposited reduce the critical dimensions of the feature.

In step 216 of FIG. 2, feature 210 is etched into substrate 206. Substrate 206 is deposited on nitride layer 208. Nitride layer 208 serves as a layer to stop the etching process. Nitride layer 208 comprises silicon nitride ($Si_3N_4$). Substrate 206 may comprise dielectric materials, including, but not limited to, oxide materials, such as fluorosilicate glass, borosilicate glass, borophosphorosilicate glass and combinations comprising at least one of the foregoing oxide materials. Substrate 206 may further comprise a low-k dielectric material. Suitable low-k dielectric materials include, but are not limited to, CORAL, a registered trademark of Novellus, SiLK a registered trademark of Dow Chemical and FLARE a registered trademark of Honeywell, and combinations comprising at least one of the foregoing low-k dielectric materials.

Substrate 206 may be deposited on nitride layer 208 using any conventional deposition techniques. For example, when substrate 206 comprises CORAL, substrate 206 may be PECVD deposited. Further, when substrate 206 comprises SiLK and/or FLARE, substrate 206 may be deposited using spin on processing.

The critical dimensions of feature 210 may be further reduced during the etching of substrate 206. Plasma polymerizing etch may also be employed to reduce the critical dimensions of feature 210 in substrate 206 in a manner similar to that used to reduce the critical dimensions of feature 210 in antireflective material 204. The term 'Litho' and accompanying two-sided arrow are used to designate the critical dimensions of feature 210 created during lithography, and the term 'Etch' and accompanying two-sided arrow are used to designate the critical dimensions of feature 210 created during the etching process.

As was mentioned above, radiation sensitive imaging layer 202 is preferably compositionally different from antireflective material 204 to provide enhanced etch selectivity between the two layers. In an exemplary embodiment, radiation sensitive imaging layer 202 comprises organic moieties. Namely, radiation sensitive imaging layer 202 comprises primarily C, H, O and in some cases fluorine (F). Radiation sensitive imaging layer does not contain any metal atoms, such as Si atoms.

As mentioned above, the teachings presented herein may be used to tune the critical dimensions of a feature, e.g., control the amount by which the critical dimensions are changed. One exemplary technique for tuning the critical dimensions of a feature is by varying the amount of inorganic moieties present in the antireflective material. Namely, the greater the inorganic content of the antireflective material is, the greater the reduction in the critical dimensions will be. For example, the antireflective materials described herein may comprise up to about four atomic percent Si. However, the amount of Si might be increased to attain a greater reduction in the critical dimensions of the feature. In an exemplary embodiment, the antireflective material comprises up to about ten atomic percent Si. In a further exemplary embodiment, the antireflective material comprises up to about 20 atomic percent Si.

Another exemplary technique for tuning the critical dimensions of a feature is by altering the composition of the plasma polymerizing etch employed to etch the antireflective material. As was mentioned above, an exemplary plasma polymerizing etch for etching the antireflective material comprises about 300 parts by volume argon gas, about 150 parts by volume nitrogen gas, about five parts by volume $C_4F_8$ gas, about five parts by volume oxygen gas and about five parts by volume $CH_3F$ gas. The composition may be altered to change the gas ratios therein. For example, the amount of $C_4F_8$ may be increased to about six parts by volume, and the amount of oxygen gas may be decreased to about four parts by volume to attain an increased reduction of the critical dimensions of the feature.

The flow of the plasma polymerizing etch may also be altered to tune the critical dimensions of a feature. Namely, nitrogen gas flows are generally much larger than fluorocarbon and oxygen gas flows. Whereas the flow of the exemplary plasma polymerizing etch highlighted above would be at about 50 standard cubic centimeters per minute (sccm), altering the nitrogen gas content could increase the flow up to about 300 sccm.

Figure 3:
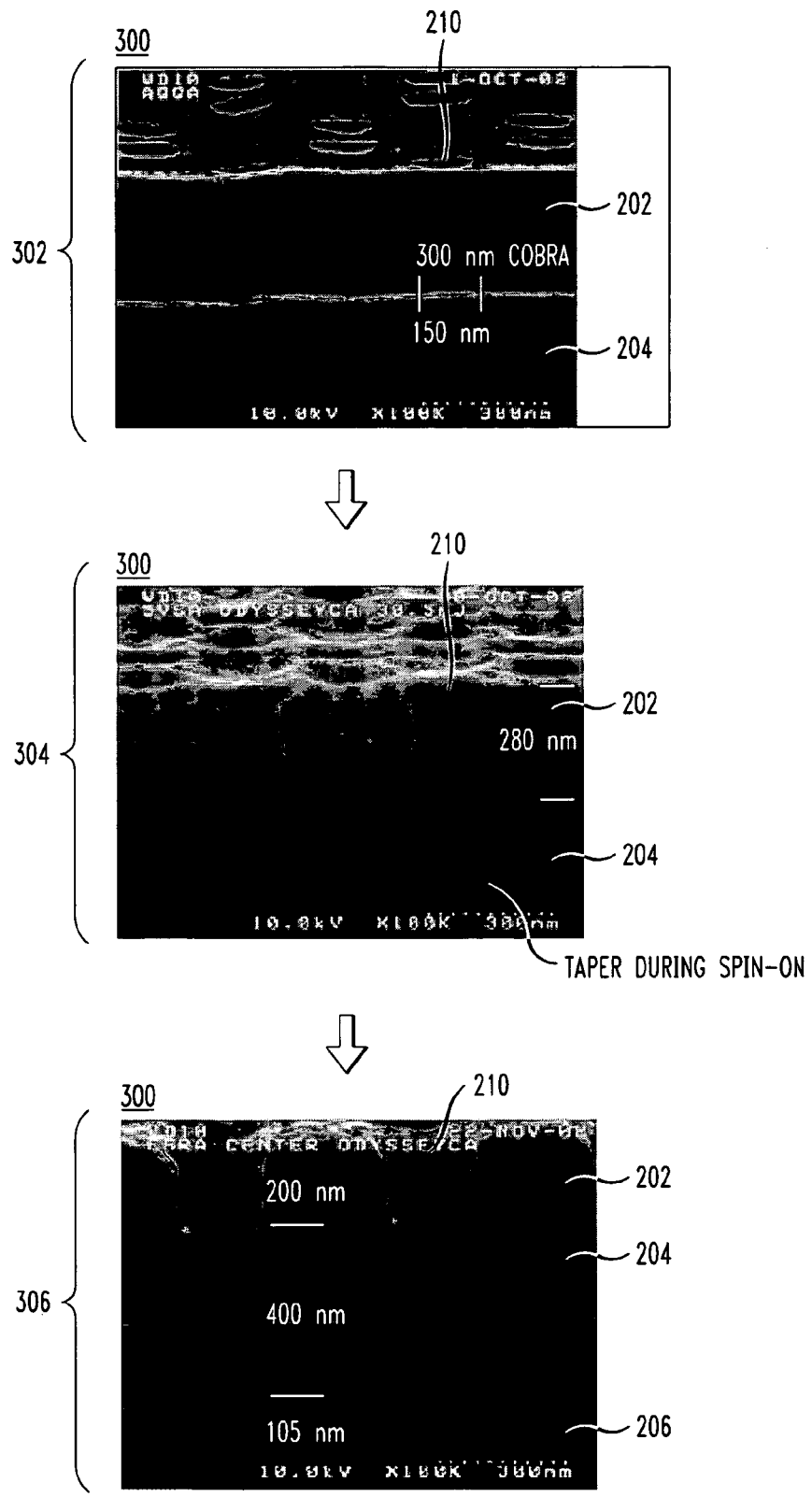
FIG. 3 is a collection of images illustrating the progressive patterning of a contact hole feature using silicon-containing antireflective material according to an embodiment of the present invention.

FIG. 3 shows the etching of a feature in a semiconductor device according to the techniques presented herein. As shown in FIG. 3, semiconductor device 300 comprises radiation sensitive imaging layer 202 deposited on antireflective material 204. Antireflective material 204 is deposited on substrate 206. Feature 210 is etched into radiation sensitive imaging layer 202, antireflective material 204 and substrate 206.

Specifically, FIG. 3 is a collection of images illustrating the progressive patterning of a contact hole feature using a silicon-containing antireflective material. In step 302 of FIG. 3, feature 210, i.e., a contact hole, is etched into radiation sensitive imaging layer 202. The critical dimensions of feature 210 are not changed during etching of radiation sensitive imaging layer 202. Radiation sensitive imaging layer 202 is formed over antireflective material 204.

In step 304 of FIG. 3, feature 210 is further etched into antireflective material 204. The critical dimensions of feature 210 are reduced by tapering through antireflective material 204. In step 306 of FIG. 3, feature 210 is further etched into substrate 206. The critical dimensions of feature 210 are further reduced by tapering through substrate 206.

Figure 4:
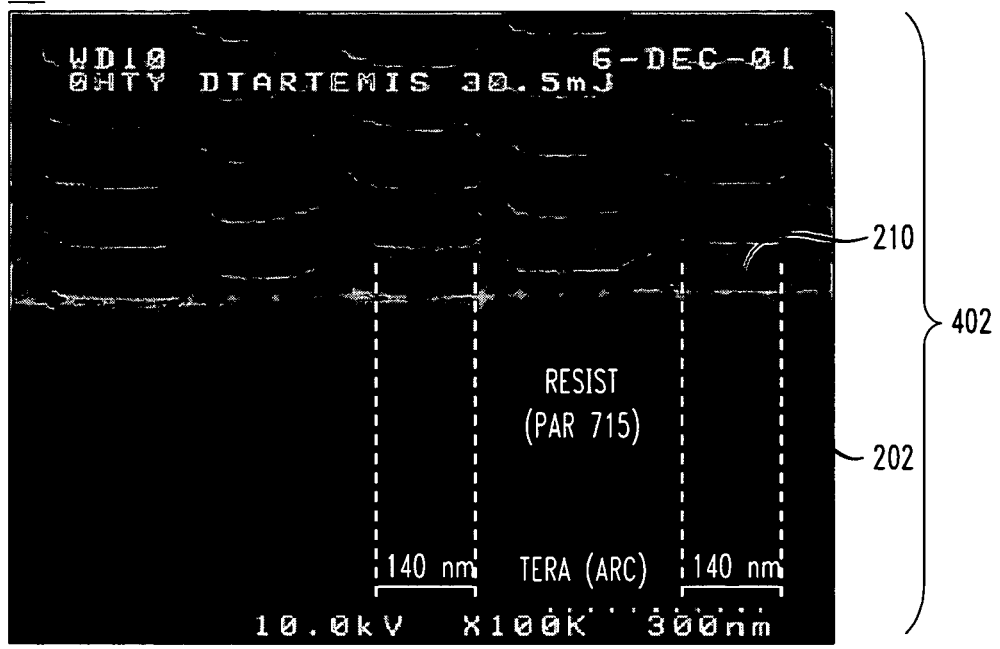
FIG. 4 is a collection of images illustrating the progressive patterning of a contact hole feature using a tunable etch resistant antireflective material (TERA) according to an embodiment of the present invention.
Figure 4:
Figure 4:
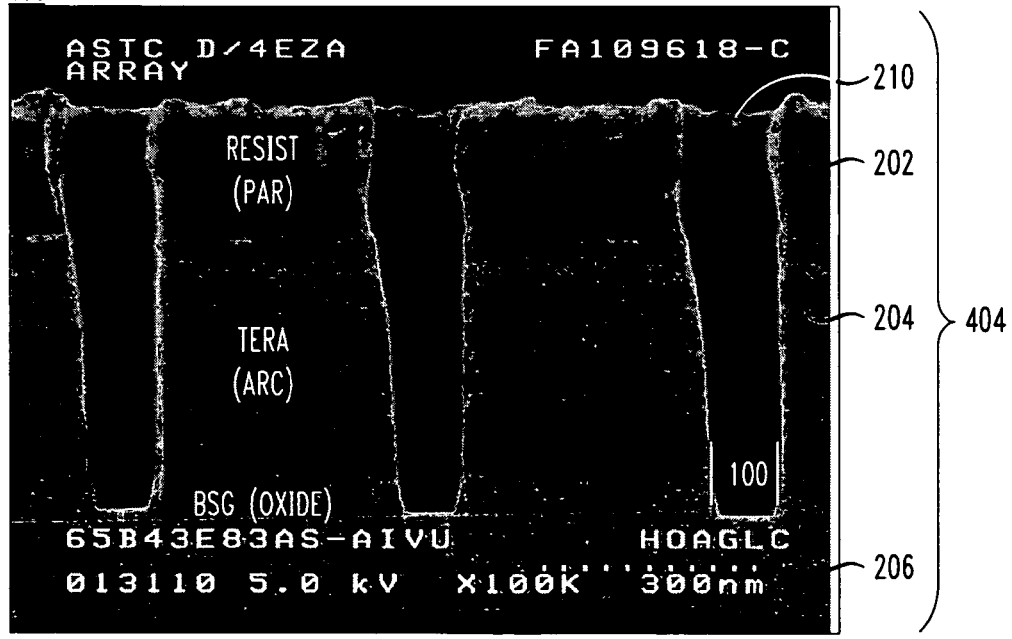

Similarly, FIG. 4 also shows the etching of a feature in a semiconductor device according to the techniques presented herein. As shown in FIG. 4, semiconductor device 400 comprises radiation sensitive imaging layer 202 deposited on antireflective material 204. Antireflective material 204 is deposited on substrate 206. Feature 210 is etched into radiation sensitive imaging layer 202, antireflective material 204 and substrate 206.

Specifically, FIG. 4 is a collection of images illustrating the progressive patterning of a contact hole feature using a tunable etch resistant antireflective material (TERA). In step 402 of FIG. 4, feature 210 is etched into radiation sensitive imaging layer 202. The critical dimensions of feature 210 are not changed during the etching of radiation sensitive imaging layer 202. Namely, the diameter of the contact hole remains at approximately 140 nanometers throughout radiation sensitive imaging layer 202. In step 404 of FIG. 4, feature 210 is further etched into antireflective material 204 and substrate 206. The critical dimensions of feature 210 are reduced by about 40 nanometers during the etching of antireflective material 204 and during the etching of substrate 206.

Thus, the inventive technique described herein results in the generation of an improved lithographic structure. The lithographic structure may comprise a substrate, an antireflective material over the substrate and a radiation sensitive imaging layer over the antireflective material. The antireflective material has a feature patterned therein. The feature has reduced critical dimensions. Further, the substrate may have a feature patterned therein. The feature may also have reduced critical dimensions.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A lithographic structure, the lithographic structure comprising an antireflective material having a feature patterned therein, the feature having at least one reduced critical dimension, wherein the antireflective material has the structural formula M:carbon:hydrogen:X, wherein M comprises one or more of a metallic and a semi-metallic element selected from the group consisting of silicon, titanium, germanium, iron, boron, tin and combinations comprising at least one of the foregoing metals or semi-metals, and X comprises an inorganic element selected from the group consisting of oxygen, nitrogen and combinations comprising at least one of the foregoing inorganic elements.

* * * * *